United States Patent
Wilson et al.

(10) Patent No.: US 6,701,515 B1
(45) Date of Patent: Mar. 2, 2004

(54) SYSTEM AND METHOD FOR DYNAMICALLY DESIGNING AND EVALUATING CONFIGURABLE PROCESSOR INSTRUCTIONS

(75) Inventors: Robert P. Wilson, Palo Alto, CA (US); Dror E. Maydan, Palo Alto, CA (US); Albert Ren-Rui Wang, Fremont, CA (US); Walter D. Lichtenstein, Belmont, MA (US); Weng Kiang Tjiang, Palo Alto, CA (US)

(73) Assignee: Tensilica, Inc., Santa Clara, CA (US)

( * ) Notice: Subject to any disclaimer, the term of this patent is extended or adjusted under 35 U.S.C. 154(b) by 0 days.

(21) Appl. No.: 09/323,161

(22) Filed: May 27, 1999

(51) Int. Cl.[7] .............................. G06F 9/44; G06F 9/45; G06F 17/50

(52) U.S. Cl. ...................... 717/117; 717/135; 717/138; 717/140; 716/1

(58) Field of Search ......................... 717/117, 100–121, 717/124–146, 149; 700/2, 97; 712/1, 15, 17, 36; 713/1, 100; 716/1

(56) References Cited

U.S. PATENT DOCUMENTS

| | | | |
|---|---|---|---|
| 5,257,379 A * | 10/1993 | Cwiakala et al. | 713/1 |
| 5,361,373 A | 11/1994 | Gilson | 712/1 |
| 5,696,956 A | 12/1997 | Razdan et al. | 712/23 |
| 5,768,567 A * | 6/1998 | Klein et al. | 703/13 |
| 5,819,064 A | 10/1998 | Razdan et al. | 703/27 |
| 5,857,106 A * | 1/1999 | Barbour et al. | 717/138 |
| 6,035,123 A | 3/2000 | Razdan et al. | 717/155 |
| 6,096,091 A * | 8/2000 | Hartmann | 716/17 |
| 6,189,140 B1 * | 2/2001 | Madduri | 717/128 |
| 6,216,191 B1 * | 4/2001 | Britton et al. | 710/305 |
| 6,321,369 B1 * | 11/2001 | Heile et al. | 716/11 |

OTHER PUBLICATIONS

Tensilica, Inc; Xtensa Instruction Set Architecture (ISA) Reference Manual Revision 1.0.
Tensilica, Inc. Instruction Extension Language (TIE) Reference Manual Revision 1.3.
Compton et al., "Configurable Computing: A Survey of Systems and Software," Technical Report, Northwestern University, Dept. of ECE, 1999.
Hauck et al., "The Chimaera Reconfigurable Functional Unit," Proceedings of the IEEE Symposium on the Field–Programmable Custom Computing Machines, 1997.
Razdan et al., "A High–Performance Microarchitecture with Hardware–Programmable Function Units," Proceedings of MICRO–27, Nov. 1997.
Wang et al., "Hardware/Software Instruction Set Configurability for System–on–Chip Processors," Proceedings of Design Automation Conference, 2001.
"Automated Processor Generation System for Designing A Configurable Processor and Method for the Same" U.S. Appln No. 09/246,047.
Xtensa Instruction Set Architecture (ISA) Reference Manual.

* cited by examiner

*Primary Examiner*—Antony Nguyen-Ba
(74) *Attorney, Agent, or Firm*—Pillsbury Winthrop LLP

(57) ABSTRACT

In selecting and building a processor configuration, a user creates a new set of user-defined instructions, places them in a file directory, and invokes a tool that processes the user instructions and transforms them into a form usable by the software development tools. The user then invokes the software development tools, telling the tools to dynamically use the instructions created in the new directory. In this way, the user may customize a processor configuration by adding new instructions and within minutes, be able to evaluate that feature. The user is able to keep multiple sets of potential instructions and easily switch between them when evaluating their application.

64 Claims, 3 Drawing Sheets

SYSTEM AND METHOD FOR DYNAMICALLY DESIGNING AND EVALUATING CONFIGURABLE PROCESSOR INSTRUCTIONS

BACKGROUND OF THE INVENTION

1. Field of the Invention

The present invention is directed to systems and techniques for designing programmable processing elements such as microprocessors and the like. More particularly, the invention is directed to the design of an application solution containing one or more processors where the processors in the system are configured and enhanced at the time of their design to improve their suitability to a particular application.

2. Background of the Related Art

U.S. Pat. No. 6,477,683 to Killian et al. (incorporated by reference) describes a system for designing microprocessors and corresponding software systems tailored for a particular application. Prior to that system, users developed programs on processors designed for running a large variety of computer programs. Because the same processor had to function well for a variety of applications, the processor would not be ideally suited for any individual application. The Killian et al. invention allows the user to tailor the microprocessor for the user's particular application and provides a core processor coupled with a graphical user interface to allow the user to easily configure his particular processor. Via a check-box menu, the user can choose to include or leave out many hardware features such as hardware multipliers, debug registers, register windows and the like. Via a menu, the user can select the sizes and characteristics of many hardware features such as the size of the cache, the number of physical registers and the like. For further configurability, the user may add user-designed instructions to the processors. The user describes the instructions using a high level hardware description language, and the system manages the integration of the instruction with the rest of the processor and creates a software system to allow programmers to use the instructions in their applications.

Once the user selects a processor configuration via the GUI, the system creates a hardware description of the configured processor as well as a software system tailored to the designed hardware. The joint hardware-software system can be built, i.e., its full hardware and software description completely developed, at the user's site using tools provided by the system vendor or can be built at the vendor's site and delivered to the customer via the Internet or some other appropriate data communications network. In either case, once the user has selected her processor configuration, the hardware and software for that configuration can be delivered in a few hours.

The above system gives the user flexibility to design a processor well-suited for her application, but is cumbersome for interactive development of hardware and software. To more fully understand this problem, consider a typical approach used by many software designers to tune the performance of their software application. They will typically think of a potential improvement, modify their software to use that potential improvement, recompile their software source to generate a runnable application containing that potential improvement and then evaluate the potential improvement. Depending on the results of that evaluation, they might keep or discard the potential improvement. Typically, the entire process can be completed in only a few minutes. This allows the user to experiment freely, quickly trying out and keeping or discarding ideas. In some cases, just evaluating a potential idea is complicated. The user might want to test the idea in a large variety of situations. In such cases, the user often keeps multiple versions of the compiled application: one original version and another version containing the potential improvement. In some cases, potential improvements might interact, and the user might keep more than two copies of the application, each using a different subset of the potential improvements. By keeping multiple versions, the user can easily test the different versions repeatedly under different circumstances.

Users of configurable processors would like to interactively develop hardware and software jointly in a similar fashion to the way that software developers develop software on traditional processors. Consider the case of users adding custom instructions to a configurable processor. Users would like to interactively add potential instructions to their processor and test and evaluate those instructions on their particular application. With prior art systems, including the Killian et al. system, this is difficult for three reasons.

First, after proposing a potential instruction, the user must wait an hour or more before obtaining a compiler and simulator that can take advantage of the instruction.

Second, when the user wishes to experiment with many potential instructions, the user must create and keep a software development system for each. The software development system can be very large. Keeping many versions can become unmanageable.

Finally, the software development system is configured for the entire processor. That makes it difficult to separate the development process among different engineers. Consider an example where two developers are working on a particular application. One developer might be responsible for deciding on cache characteristics of the processor and another responsible for adding customized instructions. While the work of the two developers is related, each piece is sufficiently separable so that each developer can work on her task in isolation. The cache developer might initially propose a particular configuration. The other developer starts with that configuration and tries out several instructions, building a software development system for each potential instruction. Now, the cache developer modifies the proposed cache configuration. The other developer must now rebuild every one of her configurations, since each of her configurations assumed the original cache configuration. With many developers working on a project, organizing the different configurations can quickly become unmanageable.

SUMMARY OF THE INVENTION

The present invention has been developed with the above problems of the prior art in mind, and an object of the present invention is to allow the user to customize a processor configuration by adding new instructions and within minutes, be able to evaluate that feature. The user is able to keep multiple sets of potential instructions or state (hereinafter the combination of potential configurable instructions or state will be referred to collectively as "processor enhancements") and easily switch between them when evaluating their application.

The user selects and builds a base processor configuration using the methods described in the Killian et al. application. The user creates a new set of user-defined processor enhancements and places them in a file directory. The user then invokes a tool that processes the user enhancements and transforms them into a form usable by the base software development tools. This transformation is very quick since it involves only the user-defined enhancements and does not build an entire software system. The user then invokes the base software development tools, telling the tools to dynamically use the processor enhancements created in the new directory. Preferably, the location of the directory is given to the tools either via a command line option or via an environment variable. To further simplify the process, the user can use standard software makefiles. These enable the user to modify their processor instructions and then via a single make command, process the enhancements and use the base software development system to rebuild and evaluate their application in the context of the new processor enhancements.

The invention overcomes the three limitations of the prior art approach. Given a new set of potential enhancements, the user can evaluate the new enhancements in a matter of minutes. The user can keep many versions of potential enhancements by creating new directories for each set. Since the directory only contains descriptions of the new enhancements and not the entire software system, the storage space required is minimal. Finally, the new enhancements are decoupled from the rest of the configuration. Once the user has created a directory with a potential set of new enhancements, she can use that directory with any base configuration.

BRIEF DESCRIPTION OF THE DRAWINGS

These and other objects, features, and advantages of the present invention are better understood by reading the following detailed description of the preferred embodiment, taken in conjunction with the accompanying drawings, in which.

DETAILED DESCRIPTION OF THE PRESENTLY PREFERRED EXEMPLARY EMBODIMENT

Figure 1:
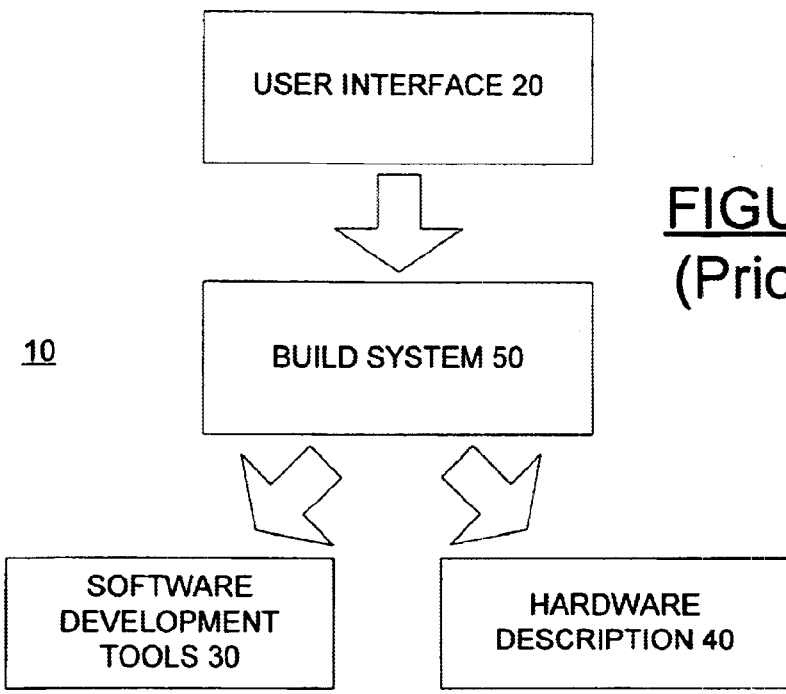
FIG. 1 is a block diagram showing the basic components of a processor configuration system according to a preferred embodiment of the present invention.
Figure 2:
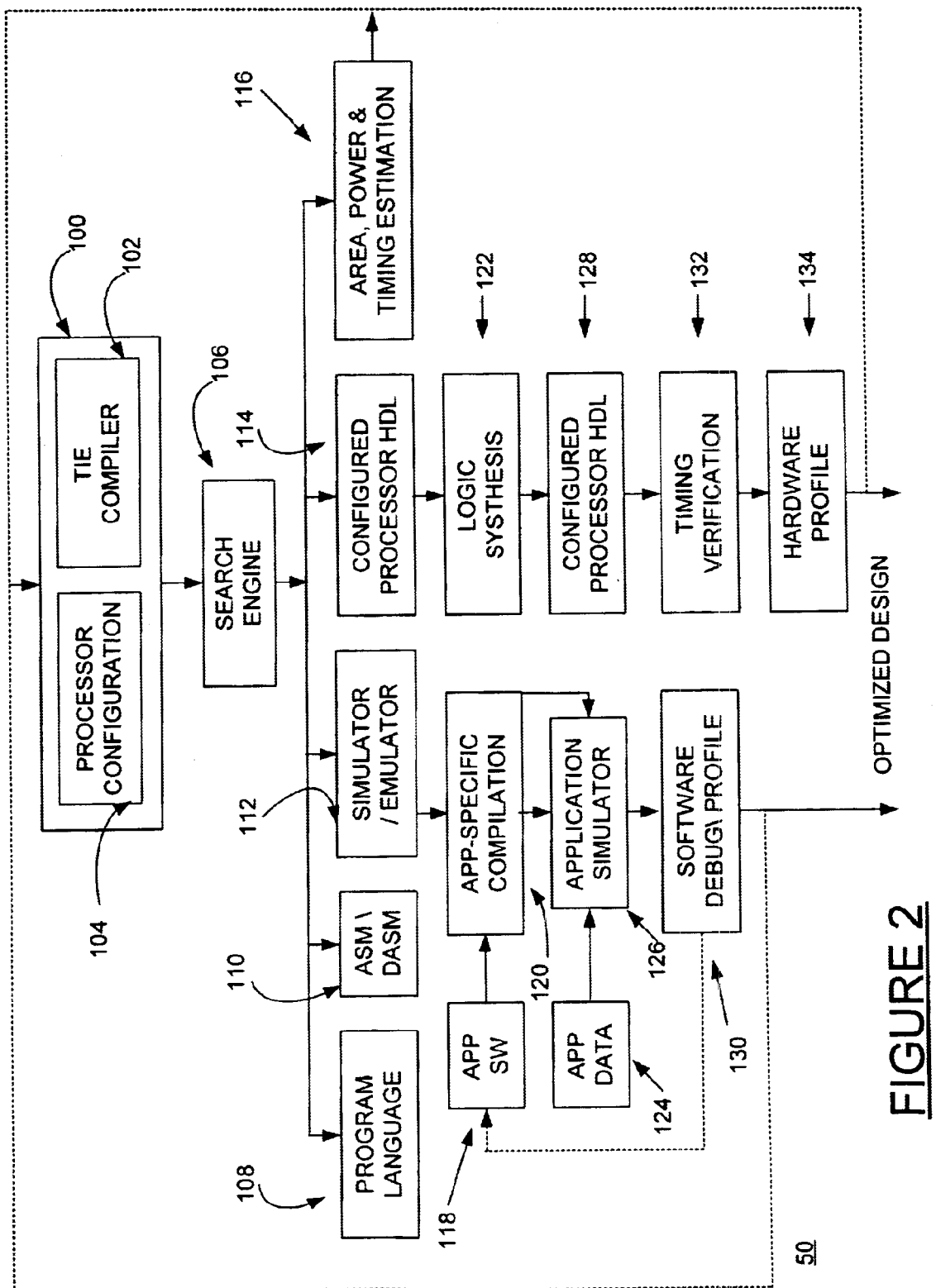
FIG. 2 is a block diagram showing the flow of processor configuration in a preferred embodiment of the present invention.

The user begins by selecting a base processor configuration via the GUI described in the Killian et al. application. As part of the process, a software development system 30 is built and delivered to the user as shown in FIG. 1. Each of these elements is described in great detail in the Killian et al. application, and further discussion in the present application of most is omitted in the interests of simplicity. However, the software development system 30 contains four key components relevant to the current invention, shown in greater detail in FIG. 2: a compiler 108, an assembler 110, an instruction set simulator 112 and a debugger 130.

A compiler, as is well known to those versed in the art, converts user applications written in high level programming languages such as C or C++ into processor-specific assembly language. High level programming languages such as C or C++ are designed to allow application writers to describe their application in a form that is easy for them to precisely describe. These are not languages understood by processors. The application writer need not necessarily worry about all the specific characteristics of the processor that will be used. The same C or C++ program can typically be used with little or no modification on many different types of processors.

The compiler translates the C or C++ program into assembly language. Assembly language is much closer to machine language, the language directly supported by the processor. Different types of processors will have their own assembly language. Each assembly instruction often directly represents one machine instruction, but the two are not necessarily identical. Assembly instructions are designed to be human readable strings. Each instruction and operand is given a meaningful name or mnemonic, allowing humans to read assembly instructions and easily understand what operations will be performed by the machine. Assemblers convert from assembly language into machine language. Each assembly instruction string is efficiently encoded by the assembler into one or more machine instructions that can be directly and efficiently executed by the processor.

Machine code can be directly run on the processor, but physical processors are not always immediately available. Building physical processors is a time-consumning and expensive process. When selecting potential processor configurations, a user cannot build a physical processor for each potential choice. Instead, the user is provided with a software program called a simulator. The simulator, a program running on a generic computer, is able to simulate the effects of running the user application on the user configured processor. The simulator is able to mimic the semantics of the simulated processor and is able to tell the user how quickly the real processor will be able to run the user's application.

A debugger is a tool that allows users to interactively find problems with their software. The debugger allows users to interactively run their programs. The user can stop the program's execution at any time and look at her C source code, the resultant assembly or machine code. The user can also examine or modify the values of any or all of her variables or the hardware registers at a break point. The user can then continue execution—perhaps one statement at a time, perhaps one machine instruction at a time, perhaps to a new user-selected break point.

Figure 3:
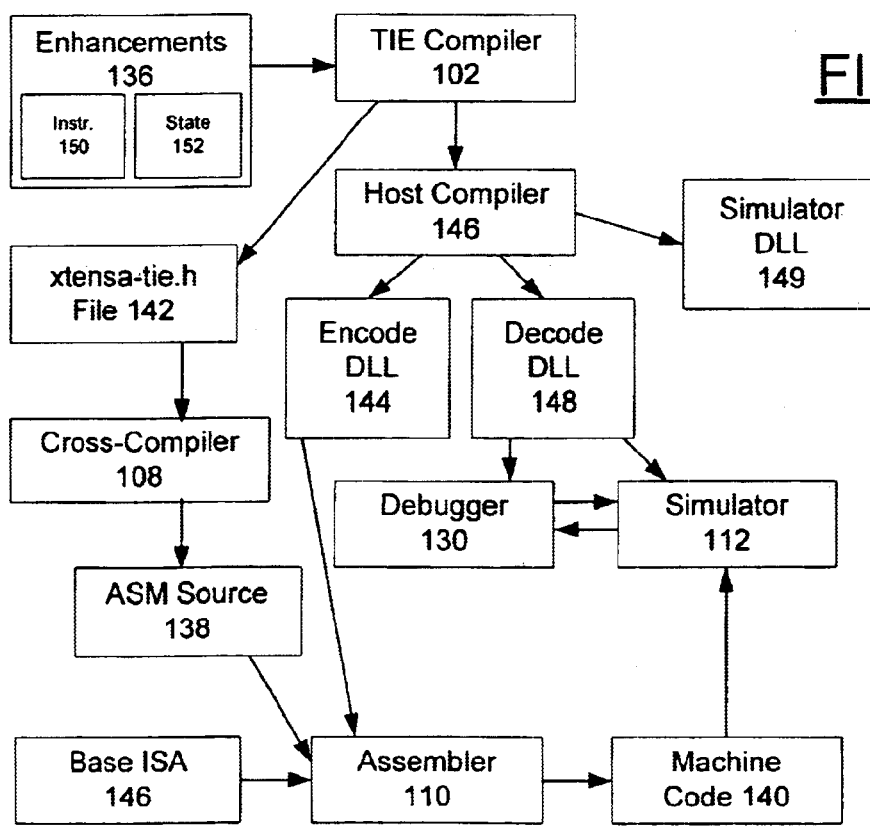
FIG. 3 is a block diagram showing the flow of information between system components in the preferred embodiment.

All four components 108, 110, 112 and 130 need to be aware of user-defined instructions 150 (see FIG. 3) and the simulator 112 and debugger 130 must additionally be aware of user-defined state 152. The system allows the user to access user-defined instructions 150 via intrinsics added to user C and C++ applications. The compiler 108 must translate the intrinsic calls into the assembly language instructions 138 for the user-defined instructions 150. The assembler 110 must take the new assembly language instructions 138, whether written directly by the user or translated by the compiler 108, and encode them into the machine instructions 140 corresponding to the user-defined instructions 150. The simulator 112 must decode the user-defined machine instructions 140. It must model the semantics of the instructions, and it must model the performance of the instructions on the configured processor. The simulator 112 must also model the values and performance implications of user-defined state. The debugger 130 must allow the user to print the assembly language instructions 138 including user-defined instructions 150. It must allow the user to examined and modify the value of user-defined state.

An appropriate vehicle for specifying the user-defined instructions 150 is the Tensilica Instruction Extension (TIE)

language developed by Tensilica, Inc. of Santa Clara, Calif., which is described in great detail in the Killian et al. application. Additionally, TIE can be used to specify other user-defined processor enhancements such as additional processor state. This is described in the U.S. Pat. No. 6,477,697 to Wang et al. entitled "A System for Adding Complex Instruction Extensions to a Microprocessor", filed on even date herewith and incorporated by reference.

The Tensilica Instruction Extension Language (TIE) Reference Manual Revision 1.3 by Tensilica, Inc. is incorporated by reference to show examples of TIE language instructions which can be used to implement such user-defined instructions. The Tensilica Instruction Set Architecture (ISA) Reference Manual Revision 1.0 is also incorporated by reference.

In the preferred embodiment, the user invokes a tool, the TIE compiler 102, to process the current potential user-defined enhancements 136. The TIE compiler 102 is different from the compiler 108 that translates the user application into assembly language 138. The TIE compiler 102 builds components which enable the already-built base software system 30 (compiler 108, assembler 110 and simulator 112 and debugger 130) to use the new, user-defined enhancements 136. Each element of the software system 30 uses a somewhat different set of components.

Figure 4:
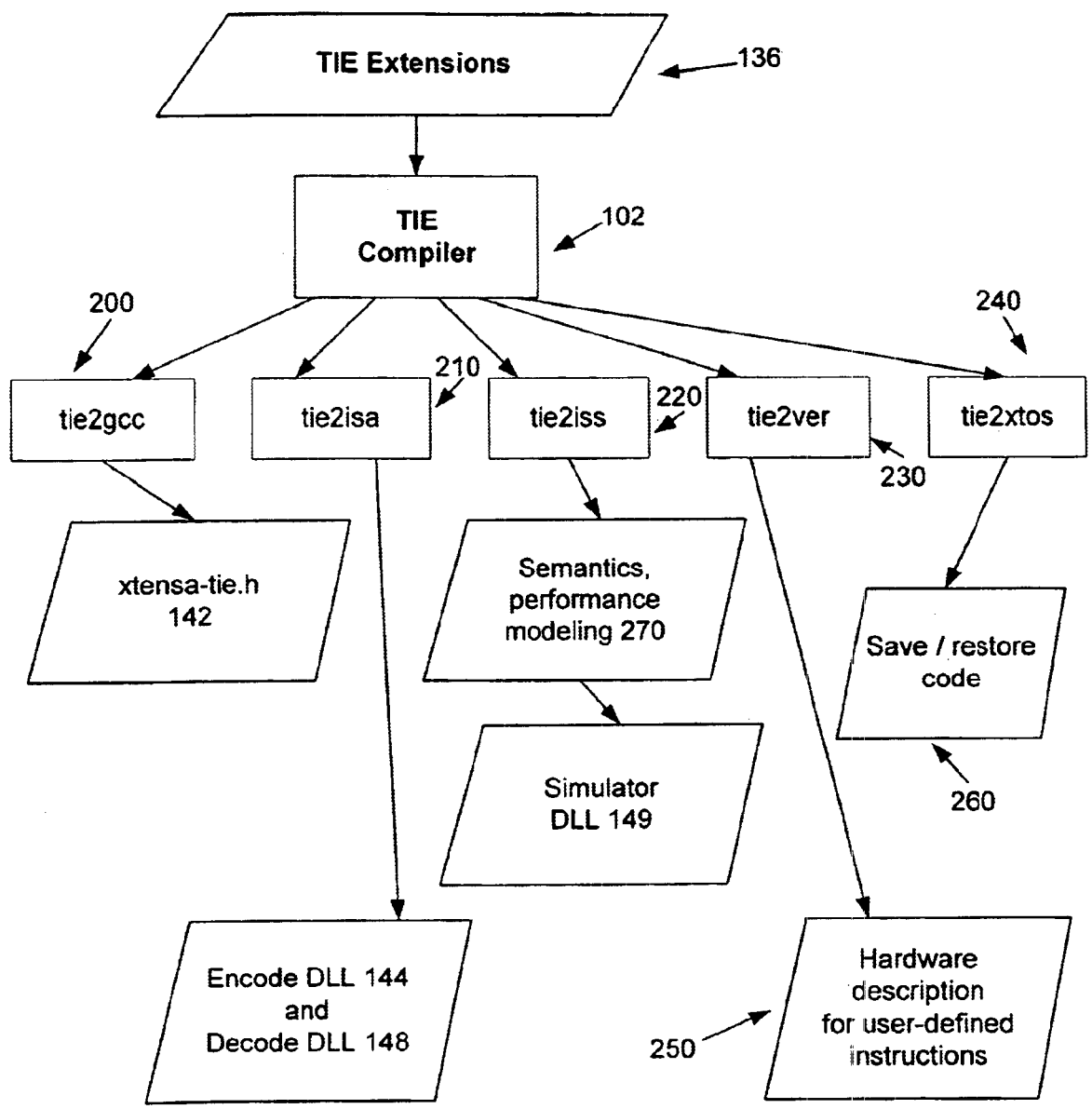
FIG. 4 is a block diagram showing how custom code is generated for the software development tools.

FIG. 4 is a diagram of how the TIE-specific portions of these software tools are generated. From the user-defined extension file 136, the TIE compiler 102 generates C code for several programs, each of which produces a file accessed by one or more of the software development tools for information about the user-defined instructions and state. For example, the program tie2gcc 200 generates a C header file 142 called xtensa-tie.h (described in greater detail below) which contains intrinsic function definitions for new instructions. The program tie2isa 210 generates a dynamic linked library (DLL) 144/148 which contains information on user-defined instruction format (a combination of encode DLL 144 and decode DLL 148 described in greater detail below). The program tie2iss 240 generates C code 270 for performance modeling and instruction semantics which, as discussed below, is used by a host comnpiler 146 to produce a simulator DLL 149 used by the simulator 112 as described in greater detail below. The program tie2ver 250 produces necessary descriptions 300 for user-defined instructions in an appropriate hardware description language. Finally, the program tie2xtos 260 produces save and restore code 310 to save and restore the user-defined state for context switching. Additional information on the implementation of user-defined state can be found in the afore-mentioned Wang et al. application.

Compiler 108

In the preferred embodiment, the compiler 108 translates intrinsic calls in the user's application into assembly language instructions 138 for the user-defined enhancements 136. The compiler 108 implements this mechanism on top of the macro and inline assembly mechanisms found in standard compilers such as the GNU compilers. For more information on these mechanisms, see, e.g., GNU C and C++ Compiler User's Guide, EGCS Version 1.0.3.

Consider a user who wishes to create a new instruction foo that operates on two registers and returns a result in a third register. The user puts the instruction description in a user-defined instruction file 150 in a particular directory and invokes the TIE compiler 102. The TIE compiler 102 creates a file 142 with a standard name such as xtensa-tie.h. That file contains the following definition of foo.

```
#define foo(ars, art) \
    ({int arr; asm volatile("foo %0,%1,%2" : "=a" (arr) : \
    "a" (ars), "a" (art)); })
```

When the user invokes the compiler 108 on her application, she tells the compiler 108 either via a command line option or an environment variable the name of the directory with the user-defined enhancements 136. That directory also contains the xtensa-tie.h file 142. The compiler 108 automatically includes the file xtensa-tie.h into the user C or C++ application program being compiled as if the user had written the definition of foo herself. The user has included intrinsic calls to the instruction foo in her application. Because of the included definition, the compiler 108 treats those intrinsic calls as calls to the included definition. Based on the standard macro mechanism provided by the compiler 108, the compiler 108 treats the call to the macro foo as if the user had directly written the assembly language statement 138 rather than the macro call. That is, based on the standard inline assembly mechanism, the compiler 108 translates the call into the single assembly instruction foo. For example, the user might have a function that contains a call to the intrinsic foo:

```
int fred(int a, int b)
{
return foo(a,b);
}
```

The compiler translates the function into the following assembly language subroutine using the user defined instruction foo:

```
fred:
.frame sp, 32
entry sp, 32
#APP
foo a2,a2,a3
#NO_APP
retw.n
```

When the user creates a new set of user-defined enhancements 136, no new compiler needs to be rebuilt. The TIE compiler 102 merely creates the file xtensa-tie.h 142 which is automatically included by the prebuilt compiler 108 into the user's application.

Assembler 110

In the preferred embodiment, the assembler I 10 uses an encode library 144 to encode assembly instructions 150. The interface to this library 144 includes functions to:.
  translate an opcode mnemonic string to an internal opcode representation;
  provide the bit patterns to be generated for each opcode for the opcode fields in a machine instruction 140; and
  encode the operand value for each instruction operand and insert the encoded operand bit patterns into the operand fields of a machine instruction 140.

As an example, consider our previous example of a user function that calls the intrinsic foo. The assembler might take the "foo a2, a2, a3" instruction and convert it into the machine instruction represented by the hexadecimal number 0x62230, where the high order 6 and the lower order 0 together represent the opcode for foo, and the 2, 2 and 3 represent the three registers a2, a2 and a3 respectively.

The internal implementations of these functions are based on a combination of tables and internal functions. Tables are easily generated by the TIE compiler 102, but their expressiveness is limited. When more flexibility is needed, such as when expressing the operand encoding functions, the TIE compiler 102 can generate arbitrary C code to be included in the library 144.

Consider again the example of "foo a2, a2, a3". Every register field is simply encoded with the number of the register. The TIE compiler 102 creates the following function that checks for legal register values, and if the value is legal, returns the register number:

```
xtensa_encode_result encode_r (valp)
u_int32_t *valp;
{
    u_int32_t val = *valp;
    if ((val >> 4) != 0)
        return xtensa_encode_result_too_high;
    *valp = val;
    return xtensa_encode_result_ok;
}
```

If all encodings were so simple, no encoding functions would be needed; a table would suffice. However, the user is allowed to choose more complicated encodings. The following encoding, described in the TIE language, encodes every operand with a number that is the value of the operand divided by 1024. Such an encoding is useful to densely encode values that are required to be multiples of 1024.

operand tx10 t {t<<10}{tx10>10}

The TIE compiler converts the operand encoding description into the following C function.

```
xtensa_encode_result encode_tx10 (valp)
u_int32_t *valp;
{
    u_int32_t t, tx10;
    tx10 = *valp;
    t = (tx10 >> 10) & 0xf;
    tx10 = decode_tx10(t);
    if (tx10 != *valp) {
        return xtensa_encode_result_not_ok;
    } else {
        *valp = t;
    }
    return xtensa_encode_result_ok;
}
```

A table can not be used for such an encoding since the domain of possible values for the operand is very large. A table would have to be very large.

In the presently preferred embodiment of the encode library 144, one table maps opcode mnemonic strings to the internal opcode representation. For efficiency, this table may be sorted or it may be a hash table or some other data structure allowing efficient searching. Another table maps each opcode to a template of a machine instruction with the opcode fields initialized to the appropriate bit patterns for that opcode. Opcodes with the same operand fields and operand encodings are grouped together. For each operand in one of these groups, the library contains a function to encode the operand value into a bit pattern and another function to insert those bits into the appropriate fields in a machine instruction. A separate internal table maps each instruction operand to these functions. Consider an example where the result register number is encoded into bits 12 . . . 15 of the instruction. The TIE compiler 102 will generate the following function that sets bits 12 . . . 15 of the instruction with the value (number) of the result register:

```
void set_r_field (insn, val)
xtensa_insnbuf insn;
u_int32_t val;
{
    insn[0] = (insn[0] & 0xffff0fff) | ((val << 12) & 0xf000);
}
```

To allow changing user-defined instructions without rebuilding the assembler 110, the encode library 144 is implemented as a dynamically linked library (DLL). DLLs are a standard way to allow a program to extend its functionality dynamically. The details of handling DLLs vary across different host operating systems, but the basic concept is the same. The DLL is dynamically loaded into a running program as an extension of the program's code. A run-time linker resolves symbolic references between the DLL and the main program and between the DLL and other DLLs already loaded. In the case of the encode library or DLL 144, a small portion of the code is statically linked into the assembler 110. This code is responsible for loading the DLL, combining the information in the DLL with the existing encode information for the pre-built instruction set 146 (which may have been loaded from a separate DLL), and making that information accessible via the interface functions described above.

When the user creates new enhancements 136, she invokes the TIE compiler 102 on a description of the enhancements 136. The TIE compiler 102 generates C code defining the internal tables and functions which implement the encode DLL 144. The TIE compiler 102 then invokes the host system's native compiler 146 (which compiles code to run on the host rather than on the processor being configured) to create the encode DLL 144 for the user-defined instructions 150. The user invokes the pre-built assembler 110 on her application with a flag or environment variable pointing to the directory containing the user-defined enhancements 136. The prebuilt assembler 110 dynamically opens the DLL 144 in the directory. For each assembly instruction, the prebuilt assembler 110 uses the encode DLL 144 to look up the opcode mnemonic, find the bit patterns for the opcode fields in the machine instruction, and encode each of the instruction operands.

For example, when the assembler 110 sees the TIE instruction "foo a2, a2, a3", the assembler 110 sees from a table that the "foo" opcode translates into the number 6 in bit positions 16 to 23. From a table, it finds the encoding functions for each of the registers. The functions encode a2 into the number 2, the other a2 into the number 2 and a3 into the number 3. From a table, it finds the appropriate set functions. Set_r_field puts the result value 2 into bit positions 12 . . . 15 of the instruction. Similar set functions appropriately place the other 2 and the 3.

Simulator 112

The simulator 112 interacts with user-defined enhancements 136 in several ways. Given a machine instruction 140, the simulator 112 must decode the instruction; i.e., break up the instruction into the component opcode and operands. Decoding of user-defined enhancements 136 is done via a function in a decode DLL 148 (it is possible that the encode DLL 144 and the decode DLL 148 are actually a single DLL). For example, consider a case where the user defines three opcodes; foo1, foo2 and foo3 with encodings 0x6, 0x16 and 0x26 respectively in bits 16 to 23 of the instruction and with 0 in bits 0 to 3. The TIE compiler 102 generates the following decode function that compares the opcode with the opcodes of all the user-defined instructions 150:

```
int decode_insn(const xtensa_insnbuf insn)
{
    if ((insn[0] & 0xff000f) == 0x60000) return xtensa_foo1_op;
    if ((insn[0] & 0xff000f) == 0x160000) return xtensa_foo2_op;
    if ((insn[0] & 0xff000f) == 0x260000) return xtensa_foo3_op;
    return XTENSA_UNDEFINED;
}
```

With a large number of user-defined instructions, comparing an opcode against all possible user-defined instructions 150 can be expensive, so the TIE compiler can instead use a hierarchical set of switch statements

```
switch (get_op0_field(insn)) {
    case 0x0:
        switch (get_op1_field(insn)) {
            case 0x6:
                switch (get_op2_field(insn)) {
                    case 0x0: return xtensa_foo1_op;
                    case 0x1: return xtensa_foo2_op;
                    case 0x2: return xtensa_foo3_op;
                    default: return XTENSA_UNDEFINED;
                }
            default: return XTENSA_UNDEFINED;
        }
    default: return XTENSA_UNDEFINED;
}
```

In addition to decoding instruction opcodes, the decode DLL 148 includes functions for decoding instruction operands. This is done in the same manner as for encoding operands in the encode DLL 144. First, the decode DLL 148 provides functions to extract the operand fields from machine instructions. Continuing the previous examples, the TIE compiler 102 generates the following function to extract a value from bits 12 to 15 of an instruction:

```
u_int32_t get_r_field (insn)
       xtensa_insnbuf insn;
{
    return ((insn[0] & 0xf000) >> 12);
}
```

The TIE description of an operand includes specifications of both encoding and decoding, so whereas the encode DLL 144 uses the operand encode specification, the decode DLL 148 uses the operand decode specification. For example, the TIE operand specification:

operand tx10 t{t<<10}{tx10>>10} produces the following operand decode function:

```
u_int32_t decode_tx10 (val)
       u_int32_t val;
{
    u_int32_t t, tx10;
    t = val;
    tx10 = t << 10;
    return tx10;
}
```

When the user invokes the simulator 112, she tells the simulator 112 the directory containing the decode DLL 148 for the user-defined enhancements 136. The simulator 112 opens the appropriate DLL. Whenever, the simulator 112 decodes an instruction, if that instruction is not successfully decoded by the decode function for the pre-built instruction set, the simulator 112 invokes the decode function in the DLL 148.

Given a decoded instruction 150, the simulator 112 must interpret and model the semantics of the instruction 150. This is done functionally. Every instruction 150 has a corresponding function that allows the simulator 112 to model the semantics of that instruction 150. The simulator 112 internally keeps track of all states of the simulated processor. The simulator 112 has a fixed interface to update or query the processor's state. As noted above, user-defined enhancements 136 are written in the TIE hardware description language which is a subset of Verilog. The TIE compiler 102 converts the hardware description into a C function used by the simulator 112 to model the new enhancements 136. Operators in the hardware description language are translated directly into the corresponding C operators. Operations that read state or 1X write state are translated into the simulator's interface to update or query the processor's state.

As an example in the preferred embodiment, consider a user creating an instruction 150 to add two registers. This example is chosen for simplicity. In the hardware description language, the user might describe the semantics of the add as follows:

semantic add {add }{assign arr=ars +art;}

The output register, signified by the built-in name arr, is assigned the sum of the two input registers, signified by the built in names ars and art. The TIE compiler 102 takes this description and generates a semantic function used by the simulator 112:

```
void add_func(u32 _OPND0_, u32 _OPND1_, u32 _OPND2_, u32 _OPND3_)
{
    set_ar( _OPND0_, ar( _OPND1_) + ar( _OPND2_) );
    pc_incr( 3 );
}
```

The hardware operator "+" is translated directly into the C operator "+". The reads of the hardware registers ars and art are translated into a call of the simulator 112 function call "ar". The write of the hardware register arr is translated into a call to the simulator 112 function "set_ar". Since every instruction implicitly increments the program counter, pc, by the size of the instruction, the TIE compiler 102 also generates a call to the simulator 112 function that increments the simulated pc by 3, the size of the add instruction.

When the TIE compiler 102 is invoked, it creates semantic functions as described IE;A above for every user-defined instruction. It also creates a table that maps all the opcode names to the associated semantic functions. The table and functions are compiled using the standard compiler 146 into the simulator DLL 149. When the user invokes the simulator 112, she tells the simulator 112 the directory containing the user-defined enhancements 136. The simulator 112 opens the appropriate DLL. Whenever the simulator 112 is invoked, it decodes all the instructions in the program and creates a table that maps instructions to the associated semantic functions. When creating the mapping, the simulator 112 opens the DLL and searches for the appropriate semantic functions. When simulating the semantics of a user-defined instruction 136, the simulator 112 directly invokes the function in the DLL.

In order to tell the user how long an application would take to run on the simulated hardware, the simulator 112 needs to simulate the performance effects of an instruction 150. The simulator 112 uses a pipeline model for this purpose. Every instruction executes over several cycles. In each cycle, an instruction uses different resources of the machine. The simulator 112 begins trying to execute all the instructions in parallel. If multiple instructions try to use the same resource in the same cycle, the latter instruction is stalled waiting for the resource to free. If a latter instruction reads some state that is written by an earlier instruction but in a later cycle, the latter instruction is stalled waiting for the value to be written. The simulator 112 uses a functional interface to model the performance of each instruction. A function is created for every type of instruction. That function contains calls to the simulator's interface that models the performance of the processor.

For example, consider a simple three register instruction foo. The TIE compiler might create the following simulator function:

```
void foo_sched (u32 op0, u32 op1, u32 op2, u32 op3)
{
    pipe_use_ifetch (3);
    pipe_use (REGF32_AR, op1, 1);
    pipe_use (REGF32_AR, op2, 1);
    pipe_def (REGF32_AR, op0, 2);
    pipe_def_ifetch (-1);
}
```

The call to pipe_use_ifetch tells the simulator 112 that the instruction will require 3 bytes to be fetched. The two calls to pipe_use tell the simulator 112 that the two input registers will be read in cycle 1. The call to pipe_def tells the simulator 112 that the output register will be written in cycle 2. The call to pipe_def_ifetch tells the simulator 112 that this instruction is not a branch, hence the next instruction can be fetched in the next cycle.

Pointers to these functions are placed in the same table as the semantic functions. The functions themselves are compiled into the same DLL 149 as the semantic functions. When the simulator 112 is invoked, it creates a mapping between instructions and performance functions. When creating the mapping, the simulator 112 opens the DLL 149 and searches for the appropriate performance functions. When simulating the performance of a user-defined instruction 136, the simulator 112 directly invokes the function in the DLL 149.

Debugger 130

The debugger interacts with user-defined enhancements 150 in two ways. First, the user has the ability to print the assembly instructions 138 for user-defined instructions 136. In order to do this, the debugger 130 must decode machine instructions 140 into assembly instructions 138. This is the same mechanism used by the simulator 112 to decode instructions, and the debugger 130 preferably uses the same DLL used by the simulator 112 to do the decoding. In addition to decoding the instructions, the debugger must convert the decoded instruction into strings. For this purpose, the decode DLL 148 includes a function to map each internal opcode representation to the corresponding mnemonic string. This can be implemented with a simple table.

The user can invoke the prebuilt debugger with a flag or environment variable pointing to the directory containing the user-defined enhancements 150. The prebuilt debugger dynamically opens the appropriate DLL 148.

The debugger 130 also interacts with user-defined state 152. The debugger 130 must be able to read and modify that state 152. In order to do so the debugger 130 communicates with the simulator 112. It asks the simulator 112 how large the state is and what are the names of the state variables. Whenever the debugger 130 is asked to print the value of some user state, it asks the simulator 112 the value in the same way that it asks for predefined state. Similarly, to modify user state, the debugger 130 tells the simulator 112 to set the state to a given value.

Thus, it is seen that implementation of support for user-defined instruction sets and state according to the present invention can be accomplished using modules defining the user functionality which are plugged-in to core software development tools. Thus, a system can be developed in which the plug-in modules for a particular set of user-defined enhancements are maintained as a group within the system for ease of organization and manipulation.

Further, the core software development tools may be specific to particular core instruction sets and processor states, and a single set of plug-in modules for user-defined enhancements may be evaluated in connection with multiple sets of core software development tools resident on the system.

The above description of the preferred embodiment of the present invention has been given for purposes of illustration only, and the invention is not so limited. Modification and variations thereof will become readily apparent to those skilled in the art, and these too are within the scope of the invention. Thus, the present invention is limited only by the scope of the appended claims.

What is claimed is:

1. A system for designing a configurable processor, the system comprising:
    core software tools that are specifically generated for the processor based on an instruction set architecture specification of the processor; and
    an enhancement tool for, based on a user-defined instruction specification, generating at least one module for use by the core software tools to evaluate the implementation of the user-defined instructions with the processor.

2. The system of claim 1, wherein the core software tools comprise software tools capable of generating code to run on the processor.

3. The system of claim 1, wherein the at least one module is implemented as a dynamically linked library.

4. The system of claim 1, wherein the at least one module is implemented as a table.

5. The system of claim 1, wherein the core software tools include a compiler for, using the at least one module, compiling an application into code using the user-defined instructions and executable by the processor.

6. The system of claim 5, wherein the at least one module includes a module for use by the compiler in compiling the user-defined instructions.

7. The system of claim 1, wherein the core software tools include an assembler for using the at least one module to assemble an application into code using the user-defined instructions and executable by the processor.

8. The system of claim 7, wherein the at least one module includes a module for use by the assembler in mapping assembly language instructions to the user-defined instructions.

9. The system of claim 8, wherein the module for use by the assembler includes data for translating an opcode mnemonic string into an internal opcode representation.

10. The system of claim 8, wherein the module for use by the assembler includes data for specifying bit patterns to be generated for opcode fields of the user-defined instructions.

11. The system of claim 8, wherein the module for use by the assembler includes data for encoding operand values into fields of machine instructions corresponding to the user-defined instructions.

12. The system of claim 8, wherein:
the system further includes a core instruction set specification specifying non user-defined instructions; and
the core instruction set specification is used by the assembler to assemble the application into code executable by the processor.

13. The system of claim 1, wherein the core software tools include an instruction set simulator for simulating code executable by the processor.

14. The system of claim 13, wherein the at least one module includes a simulator module for use by the simulator in simulating execution of the user-defined instructions.

15. The system of claim 14, wherein the module for use by the simulator includes data for decoding the user-defined instructions.

16. The system of claim 15, wherein the simulator uses a module to decode instructions using the simulator module when they cannot be decoded as predefined instructions.

17. The system of claim 14, wherein the module for use by the simulator includes data for interpreting and modeling semantics of the user-defined instructions.

18. The system of claim 14, wherein the module for use by the simulator includes data describing a user-defined state for use in simulations.

19. The system of claim 14, wherein the module for use by the simulator includes data for determining performance of the user-defined instructions.

20. The system of claim 1, wherein the core software tools include a debugger for using the at least one module to debug code using the user-defined instructions and executable by the processor.

21. The system of claim 20, wherein the at least one module includes a module usable by the debugger to decode machine instructions into assembly instructions.

22. The system of claim 20, wherein the at least one module includes a module usable by the debugger to convert assembly instructions into strings.

23. The system of claim 20, wherein:
the core software tools include an instruction set simulator for simulating code executable by the processor; and
the debugger is for communicating with the simulator to obtain information on a user-defined state for debugging.

24. The system of claim 1, wherein a single user-defined instruction can be used unmodified by multiple core software tools based on different core instruction set specifications.

25. A system for designing a configurable processor, the system comprising:
core software tools that are specifically generated for the processor based on an instruction set architecture specification of the processor,
an enhancement tool for, based on a user-defined instruction specification, generating at least one module for use by the core software tools to evaluate the implementation of the user-defined instructions with the processor; and
storage means for concurrently storing groups generated by the enhancement tool, each of the groups corresponding to a different set of user-defined instructions.

26. The system of claim 25, wherein the at least one module is implemented as a dynamically linked library.

27. The system of claim 25, wherein the at least one module is implemented as a table.

28. The system of claim 25, wherein the core software tools include a compiler for, using the at least one module, compiling an application into code using the user-defined instructions and executable by the processor.

29. The system of claim 28, wherein the at least one module includes a module for use by the compiler in compiling the user-defined instructions.

30. The system of claim 25, wherein the core software tools include an assembler for using the at least one module to assemble an application into code using the user-defined instructions and executable by the processor.

31. The system of claim 30, wherein the at least one module includes an encode module for use by the assembler in mapping assembly language instructions to the user-defined instructions.

32. The system of claim 31, wherein the encode module includes data for translating an opcode mnemonic string into an internal opcode representation.

33. The system of claim 31, wherein the module for use by the assembler includes data for specifying bit patterns to be generated for opcode fields of the user-defined instructions.

34. The system of claim 31, wherein the module for use by the assembler includes data for encoding operand values into fields of machine instructions corresponding to the user-defined instructions.

35. The system of claim 25, wherein the core software tools include an instruction set simulator for simulating code executable by the processor.

36. The system of claim 35, wherein the at least one module includes a module for use by the simulator in simulating execution of the user-defined instructions.

37. The system of claim 36, wherein the module for use by the simulator includes data for decoding the user-defined instructions.

38. The system of claim 37, wherein the simulator uses a module to decode instructions using the simulator module when they cannot be decoded as predefined instructions.

39. The system of claim 36, wherein the module for use by the simulator includes data for interpreting and modeling semantics of the user-defined instructions.

40. The system of claim 36, wherein the module for use by the simulator includes data describing a user-defined state for use in simulations.

41. The system of claim 36, wherein the module for use by the simulator includes data for determining performance of the user-defined instructions.

42. The system of claim 25, wherein the core software tools include a debugger for using the at least one module to debug code using the user-defined instructions and executable by the processor.

43. The system of claim 42, wherein the at least one module includes a module usable by the debugger to decode machine instructions into assembly instructions.

44. The system of claim 42, wherein the at least one module includes a module usable by the debugger to convert assembly instructions into strings.

45. A system for designing a configurable processor, the system comprising:
 a plurality of groups of core software tools, each group being specifically generated for the processor based on a respective instruction set architecture specification of the processor; and
 an enhancement tool for, based on a user-defined instruction specification, generating at least one module for use by one of the groups of the core software tools to evaluate the implementation of the user-defined instructions with the processor.

46. The system of claim 45, wherein the at least one module is implemented as a dynamically linked library.

47. The system of claim 45, wherein the at least one module is implemented as a table.

48. The system of claim 45, wherein at least one group of core software tools includes a compiler for, using the at least one module, compiling an application into code using the user-defined instructions and executable by the processor.

49. The system of claim 48, wherein the at least one module includes a module for use by the compiler in compiling the user-defined instructions.

50. The system of claim 45, wherein at least one group of core software tools includes an assembler for using the at least one module to assemble an application into code using the user-defined instructions and executable by the processor.

51. The system of claim 50, wherein the at least one module includes a module for use by the assembler in mapping assembly language instructions to the user-defined instructions.

52. The system of claim 51, wherein the module for use by the assembler includes data for translating an opcode mnemonic string into an internal opcode representation.

53. The system of claim 51, wherein the module for use by the assembler includes data for specifying bit patterns to be generated for opcode fields of the user-defined instructions.

54. The system of claim 51, wherein the module for use by the assembler includes data for encoding operand values into fields of machine instructions corresponding to the user-defined instructions.

55. The system of claim 45, wherein at least one group of core software tools includes an instruction set simulator for simulating code executable by the processor.

56. The system of claim 55, wherein the at least one module includes a module for use by the simulator in simulating execution of the user-defined instructions.

57. The system of claim 56, wherein the module for use by the simulator includes data for decoding the user-defined instructions.

58. The system of claim 57, wherein the simulator uses a module to decode instructions using the simulator module when they cannot be decoded as predefined instructions.

59. The system of claim 56, wherein the module for use by the simulator includes data for interpreting and modeling semantics of the user-defined instructions.

60. The system of claim 56, wherein the module for use by the simulator includes data describing the user-defined state for use in simulations.

61. The system of claim 56, wherein the module for use by the simulator includes data for determining performance of the user-defined instructions.

62. The system of claim 45, wherein at least one group of core software tools includes a debugger for using the at least one module to debug code using the user-defined instructions and executable by the processor.

63. The system of claim 62, wherein the at least one module includes a module usable by the debugger uses to decode machine instructions into assembly instructions.

64. The system of claim 62, wherein the at least one module includes a module usable by the debugger to convert assembly instructions into strings.

* * * * *